(12) United States Patent
Buffiere et al.

(10) Patent No.: US 9,231,148 B2
(45) Date of Patent: Jan. 5, 2016

(54) METHOD FOR CLEANING AND PASSIVATING CHALCOGENIDE LAYERS

(71) Applicants: IMEC, Leuven (BE); Katholieke Universiteit Leuven, KU LEUVEN R&D, Leuven (BE); Universiteit Hasselt, Hasselt (BE)

(72) Inventors: Marie Buffiere, Echire (FR); Marc Meuris, Keerbergen (BE); Guy Brammertz, Kettenis (BE)

(73) Assignees: IMEC, Leuven (BE); Katholieke Universiteit Leuven, KU Leuven R&D, Leuven (BE); Universiteit Hasselt, Hasselt (BE)

( * ) Notice: Subject to any disclaimer, the term of this patent is extended or adjusted under 35 U.S.C. 154(b) by 0 days.

(21) Appl. No.: 14/500,871

(22) Filed: Sep. 29, 2014

(65) Prior Publication Data
US 2015/0125987 A1    May 7, 2015

(30) Foreign Application Priority Data
Nov. 7, 2013   (EP) ..................................... 13191997

(51) Int. Cl.
| | | |
|---|---|---|
| H01L 31/18 | (2006.01) | |
| H01L 31/0749 | (2012.01) | |
| H01L 31/032 | (2006.01) | |
| H01L 31/072 | (2012.01) | |
| H01L 21/02 | (2006.01) | |

(52) U.S. Cl.
CPC ........ *H01L 31/1868* (2013.01); *H01L 31/0326* (2013.01); *H01L 31/072* (2013.01); *H01L 31/0749* (2013.01); *H01L 21/02485* (2013.01); *H01L 21/02557* (2013.01); *H01L 21/02658* (2013.01)

(58) Field of Classification Search
CPC .... Y02E 10/50; H01L 21/3221; H01L 31/186
See application file for complete search history.

(56) References Cited

U.S. PATENT DOCUMENTS

| 8,435,826 B1 * | 5/2013 | Lee ................................ 438/85 |
| 2013/0284251 A1 * | 10/2013 | Krasnov et al. ............... 136/256 |
| 2014/0027884 A1 * | 1/2014 | Tang et al. .................... 257/632 |
| 2014/0273407 A1 * | 9/2014 | Christensen et al. ......... 438/476 |

FOREIGN PATENT DOCUMENTS

EP    2 164 094 A1    3/2010

OTHER PUBLICATIONS

Delahoy et al. "Charging and discharging of defect states in CIGS/ZnO junctions" Thin Solid Films 361-362 (2000) 140-144.

* cited by examiner

*Primary Examiner* — Michael Jung
*Assistant Examiner* — Charles R Peters
(74) *Attorney, Agent, or Firm* — Knobbe Martens Olson & Bear, LLP

(57) ABSTRACT

A method for chemically cleaning and passivating a chalcogenide layer is provided, wherein the method comprises bringing the chalcogenide layer into contact with an ammonium sulfide containing ambient, such as an ammonium sulfide liquid solution or an ammonium sulfide containing vapor. Further, a method for fabricating photovoltaic cells with a chalcogenide absorber layer is provided, wherein the method comprises: providing a chalcogenide semiconductor layer on a substrate; bringing the chalcogenide semiconductor layer into contact with an ammonium sulfide containing ambient, thereby removing impurities and passivating the chalcogenide semiconductor layer; and afterwards providing a buffer layer on the chalcogenide semiconductor layer.

21 Claims, 5 Drawing Sheets

METHOD FOR CLEANING AND PASSIVATING CHALCOGENIDE LAYERS

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Application No. EP 13191997.9 filed Nov. 7, 2013. The aforementioned application is incorporated by reference herein in its entirety, and is hereby expressly made a part of this specification.

FIELD

The present disclosure relates to methods for chemically cleaning and passivating chalcogenide layers. More in particular, the present disclosure relates to methods for chemically cleaning and passivating chalcogenide semiconductor layers that may be used as active layers in semiconductor devices such as absorber layers in photovoltaic cells. The present disclosure further relates to methods for fabricating chalcogenide based photovoltaic cells.

STATE OF THE ART

Chalcopyrite ternary thin films, such as copper-indium-gallium-sulfoselenide ($CuIn_{1-x}Ga_x(S,Se)_2$) films, and kesterite quaternary thin films, such as copper-zinc-tin-sulfoselenide ($Cu_2ZnSn(S,Se)_4$) films, generically referred to as CIGS and CZTS, have become the subject of considerable interest and study for semiconductor devices in recent years. These materials are also referred to as $I-III-VI_2$ and $I_2-II-IV-VI_4$ materials according to their constituent elemental groups. These materials are of particular interest for use as an absorber layer in photovoltaic devices.

For photovoltaic applications, a p-type CIGS or CZTS layer may be combined with a thin n-type semiconductor layer such as for example a CdS layer to form a p-n heterojunction CdS/CIGS or CdS/CZTS device. The preparation of the CIGS or CZTS absorber layer requires temperatures around 400° C. to 600° C. and a vacuum environment. During this preparation, the formation of trace amounts of binary/ternary compositions (secondary phases or impurity phases) consisting of selenides, oxides, carbonates, etc., may occur. These trace amounts of impurity phases may be formed at the nascent absorber surfaces. The presence of such impurities at the CIGS or CZTS surfaces negatively affects photovoltaic conversion efficiencies of photovoltaic cells comprising these materials. Therefore, there is a need to clean the CIGS or CZTS surfaces before the deposition of the CdS buffer layer, to remove these impurities and to avoid their negative influence on the photovoltaic conversion efficiency.

In addition, photovoltaic cell conversion efficiencies may be improved by the passivation of defects that are inherently present in the compound semiconductor chalcogenide material. Passivation of these defects may lead to longer minority carrier lifetimes and higher photovoltaic cell efficiencies.

Copper selenide ($Cu_xSe$) is a common secondary phase in copper indium gallium selenide (CIGS) and copper zinc tin selenide (CZTS) layers. While a copper-rich layer composition may lead to enhanced grain growth, it results in the formation of a $Cu_xSe$ phase which can increase the shunt conductance in a photovoltaic cell comprising such absorber layer. Selective etching of the secondary phase after grain growth solves this problem.

It is known that copper-selenide ($Cu_xSe$) impurities and most probably also copper-sulfide ($CU_xS$) impurities may be selectively removed (etched) by means of a potassium cyanide (KCN) solution. However, KCN is a highly toxic compound, and therefore an alternative, safer compound would be more suitable for industrial processing of photovoltaic cells.

Alternative solutions for removing $Cu_xSe$ compounds from a CIGS surface have been reported, including chemical, electrochemical and thermal treatments. Chemical treatments may for example comprise treatment in ammonia combined with heating, or bromine/methanol treatment, bromine being a toxic compound. Electrochemical treatments have the disadvantage that the substrate needs to be contacted with electrodes. Thermal treatments may lead to stress and cracks in the layers, e.g. due to differences in thermal expansion coefficient between the CIGS layer and the substrate.

Methods for the passivation of CIGS layer surfaces have been reported. For example, CIGS films may be treated in an aqueous solution containing $InCl_3$ and $CH_3CSNH_2$, resulting in the formation of a passivating $CuInS_2$ layer on the CIGS surface and to an improved photovoltaic cell efficiency. Alternatively, CIGS films may be treated in a Cd or Zn containing solution by immersing the films in the solution and heating. Another alternative method for passivation comprises thermal annealing, e.g. in an $H_2S$ containing environment.

SUMMARY

The present disclosure aims to provide methods for chemically removing, typically undesired, secondary phases (impurity phases) from chalcogenide layers, wherein less toxic chemicals are used as compared to prior art methods.

The present disclosure aims to provide methods for chemically removing secondary phases (impurity phases) from chalcogenide layers, wherein the surface of the chalcogenide layers is simultaneously passivated.

The present disclosure aims to provide methods for chemically removing secondary phases (impurity phases) from chalcogenide layers, wherein the chemical removing may be done without heating.

In embodiments of the present disclosure the chalcogenide layer may comprise a chalcogenide semiconductor material. In embodiments of the present disclosure the chalcogenide layer may for example comprise Cu. The chalcogenide layer may for example comprise a ternary or a quaternary chalcogenide material. For example, the chalcogenide material may be a Group $I_2-II-IV-VI_4$ material such as Copper Zinc Tin Sulfide (CZTS) or Copper Zinc Tin Selenide (CZTSe), or it may be a Group $I-III-VI_2$ material such as Copper Indium Gallium Sulfide (CIGS) or Copper Indium Gallium Selenide (CIGSe), the present disclosure not being limited thereto.

The disclosure is related to methods for chemically cleaning and passivating chalcogenide layers. In the context of the present disclosure, "chemically cleaning" means chemically removing secondary phases or impurity phases formed e.g. during the preparation of chalcogenide layers. Such secondary phases or impurity phases may for example contain Cu, the present disclosure not being limited thereto. In the context of the present disclosure, "chemically passivating" means chemically increasing the lifetime of minority carriers in the chalcogenide layer near its surface (i.e. increasing the lifetime of minority carriers in the chalcogenide layer near its surface by purely chemical treatment or processes), or chemically reducing the recombination velocity of minority carriers in the chalcogenide layer at or near its surface (i.e. reducing the recombination velocity of minority carriers in the chalcogenide layer at or near its surface by purely chemical treatment or processes).

The present disclosure provides a method for chemically cleaning and passivating a chalcogenide layer formed on a substrate, wherein the method comprises contacting the chalcogenide layer with an ammonium sulfide $((NH_4)_2S)$ containing ambient, i.e. by bringing in contact the chalcogenide layer and the ammonium sulfide $((NH_4)_2S)$ containing ambient, e.g. by exposing the chalcogenide layer to the ammonium sulfide $((NH_4)_2S)$ containing ambient.

Contacting the chalcogenide layer with an ammonium sulfide containing ambient may comprise soaking or dipping or immersing the chalcogenide layer in a liquid solution containing ammonium sulfide. This may for example be done at ambient temperature, using a 1 weight percentage (wt %) to 50 wt % solution, e.g. a 10 wt % to 30 wt % solution, of ammonium sulfide in water, for about 1 minute to about 60 minutes.

Alternatively, contacting the chalcogenide layer with an ammonium sulfide containing ambient may comprise bringing the chalcogenide layer in an ambient containing ammonium sulfide vapor. This may for example be done by placing the chalcogenide layer in a closed container (e.g. closed beaker) containing an ammonium sulfide solution, for example for 10 to 60 minutes, e.g. without heating, i.e. at ambient temperature.

After the step of contacting the chalcogenide layer with an ammonium sulfide containing ambient, a rinsing step may be performed, for example comprising rinsing in deionized water for a few minutes, e.g. 1 to 5 minutes.

In a method of the present disclosure, the chalcogenide layer may be formed on the substrate by means of any suitable method known by a person skilled in the art, such as for example co-evaporation, Molecular Beam Epitaxy or solution processing, the present disclosure not being limited thereto. The substrate may for example be a soda lime glass substrate coated with a Mo thin film, or any other suitable substrate that withstands the temperatures and atmosphere used during the formation of the chalcogenide layer.

Methods of the present disclosure may advantageously be used for treating (cleaning, passivating) thin chalcogenide films such as CIGS or CZTS films used as an absorber layer in photovoltaic cells, before the deposition of a buffer layer such as a CdS buffer layer on the absorber layer.

It is an advantage of a method for chemically cleaning a chalcogenide layer according to the present disclosure that it uses a less toxic and safer chemical compound as compared to methods wherein potassium cyanide (KCN) is used for removing, i.e. etching, Cu-rich and Se-rich phases present on chalcogenide layers or films, such as for example CIGSe or CIGS or CZTSe or CZTS thin films used in thin film photovoltaic cells.

It is an advantage of a method for chemically cleaning a chalcogenide layer according to the present disclosure that it not only results in removal of secondary phases but that it simultaneously results in passivation of the chalcogenide layer, in particular surface passivation of the chalcogenide layer. The etching or cleaning and the passivation are thus performed in a single process step.

It is an advantage of a method for chemically cleaning a chalcogenide layer according to the present disclosure that it may be performed at ambient temperature, i.e. it may be performed without heating.

The present disclosure further provides a method for fabricating photovoltaic cells, wherein the method comprises: providing a chalcogenide semiconductor layer on a substrate; contacting the chalcogenide semiconductor layer with an ammonium sulfide $((NH_4)_2S)$ containing ambient (i.e. by bringing in contact the chalcogenide layer and the ammonium sulfide $((NH_4)_2S)$ containing ambient, e.g. by exposing the chalcogenide layer to an ammonium sulfide $((NH_4)_2S)$ containing ambient), thereby removing impurities from and passivating the chalcogenide semiconductor layer; and afterwards providing a buffer layer on the chalcogenide semiconductor layer.

Contacting the chalcogenide layer with an ammonium sulfide containing ambient may comprise soaking or dipping or immersing the substrate with the chalcogenide layer in a liquid solution containing ammonium sulfide. This may for example be done at ambient temperature, using a 1 wt % to 50 wt % solution of ammonium sulfide, for about 1 minute to 60 minutes.

Alternatively, contacting the chalcogenide layer with an ammonium sulfide containing ambient may comprise bringing the substrate with the chalcogenide layer in an ambient containing ammonium sulfide vapor. This may for example be done by placing the chalcogenide layer in a closed container (e.g. closed beaker) containing an ammonium sulfide solution, for example for 10 to 60 minutes, e.g. without heating, i.e. at ambient temperature.

After the step of contacting the chalcogenide layer with an ammonium sulfide containing ambient, a rinsing step may be performed, for example comprising rinsing in deionized water for a few minutes, e.g. 1 to 5 minutes.

In a method for fabricating photovoltaic cells according to the present disclosure, the buffer layer may for example be a CdS layer, a zinc oxy-sulfide (Zn(O,S)) layer or an indium sulfide $(In_2S_3)$ layer, the present disclosure not being limited thereto.

The method for fabricating photovoltaic cells of the present disclosure may further comprise: providing a rear contact layer on the substrate before providing the chalcogenide semiconductor layer, e.g. directly on top of the rear contact layer; providing a window layer, the window layer being an optically transparent layer e.g. comprising a high band-gap material, such as for example a ZnO layer, on top of the buffer layer; and providing front contacts.

It is an advantage of a method for fabricating photovoltaic cells according to the present disclosure that it enables the fabrication of cells with improved current-voltage characteristics and with improved cell efficiency.

Certain objects and advantages of various inventive aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

Figure 1:
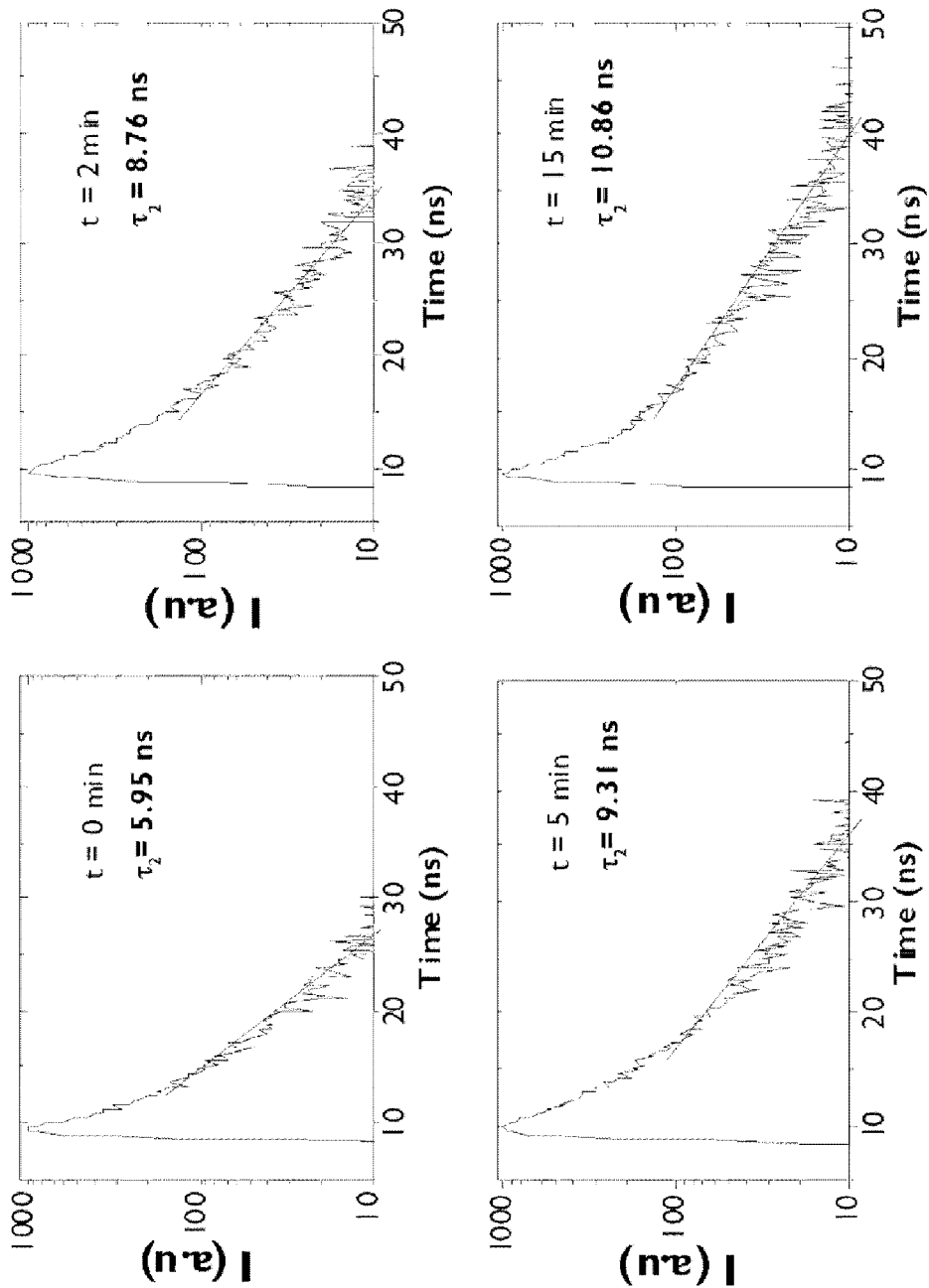
FIG. 1 shows the result of lifetime measurements on CIGSe layers after contacting with an ammonium sulfide containing liquid according to a method of the present disclosure, for different contacting times (t=0, 2, 5 and 15 minutes).

Any reference signs in the claims shall not be construed as limiting the scope of the present disclosure.

In the different drawings, the same reference signs refer to the same or analogous elements.

DETAILED DESCRIPTION

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

In the context of the present disclosure, a "Cu-rich" layer or a "Cu-rich" chalcogenide layer is a chalcogenide layer comprising a more than stoichiometric amount of Cu. For example, a Cu-rich CIGS layer is a layer wherein $[Cu]/([In]+[Ga])$ is larger than 1. For example, a Cu-rich CZTS layer is a CZTS layer wherein $[Cu]/([Zn]+[Sn])$ is larger than 1. Similarly, in the context of the present disclosure, a "Cu-poor" chalcogenide layer is a chalcogenide layer comprising a less than stoichiometric amount of Cu, such as for example a CIGS layer wherein $[Cu]/([In]+[Ga])$ is smaller than 1.

A method of the present disclosure comprises chemically cleaning a chalcogenide layer formed on a substrate by contacting the chalcogenide layer with an ammonium sulfide $((NH_4)_2S)$ containing liquid or vapor, thereby removing impurities and/or secondary phases from the chalcogenide layer.

Experiments were done wherein a $CuIn_{0.7}Ga_{0.3}Se_2$ (CIGSe) layer was deposited by co-evaporation on a glass substrate covered with a Molybdenum (Mo) layer. The thickness of the CIGSe layer was about 2 micrometer. Due to the presence of a $Cu_xSe$ phase the average Cu ratio $([Cu]/([In]+[Ga])$ was about 1.1. The substrate with the Cu-rich CIGSe layer was then dipped in a 20% $(NH_4)_2S$ solution for 1 minute, 3 minutes and 12 minutes respectively, followed by 3 minutes of rinsing in deionized water. Based on a SEM analysis it was shown that the surface of the Cu-rich CIGSe layer was etched by the $(NH_4)_2S$ solution. From a comparison with samples etched in KCN, it was concluded that the $Cu_xSe$ secondary phase had been removed by the $(NH_4)_2S$ treatment after 12 minutes of etching.

Figure 6:
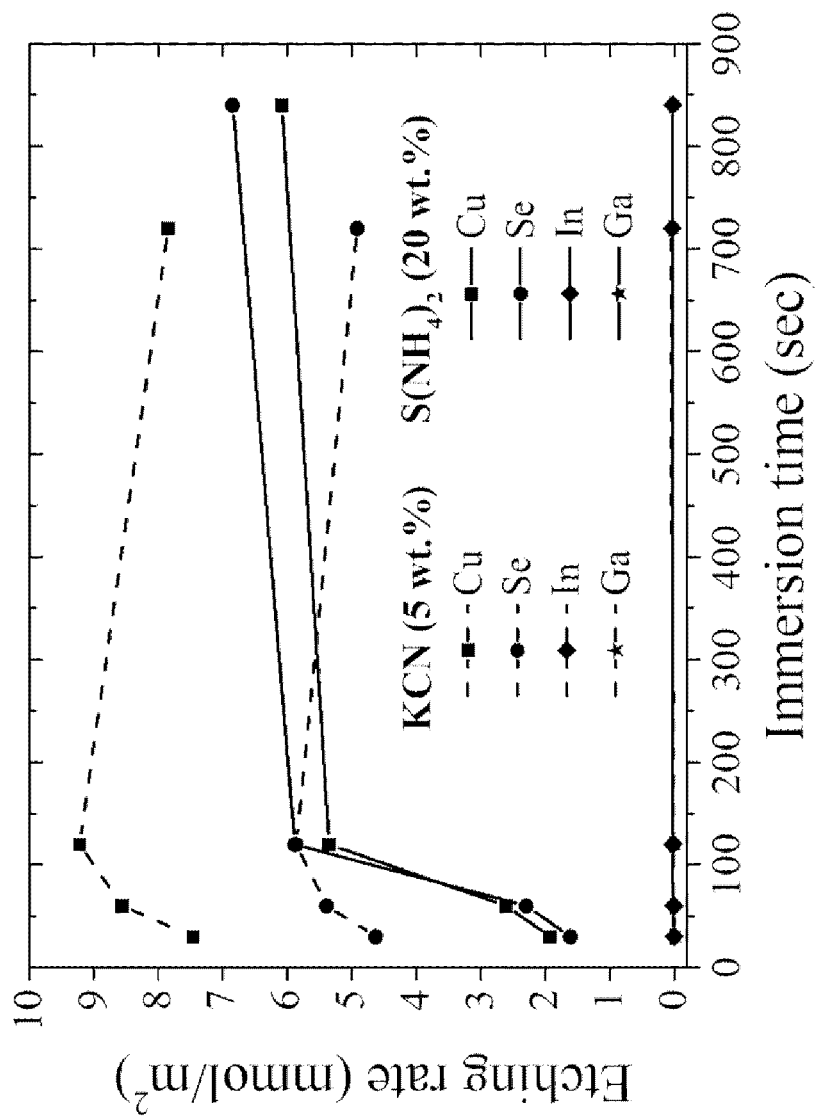
FIG. 6 illustrates the evolution of the chemical concentrations of Cu, In, Ga and Se as found by ICP-AES measurements performed on Cu-rich CIGSe samples after different immersion times in KCN or $S(NH_4)_2$ solutions.

FIG. 6 shows the evolution of the concentrations of Cu, Se, In and Ga species in the KCN or $S(NHd_2$ solutions for different immersion times (i.e., 30, 60, 120, 740 or 840 s) of Cu-rich CIGSe samples ($[Cu]/[In+Ga]=1.2$), as measured by Inductively Coupled Plasma Atomic Emission Spectroscopy (ICP-AES). Both chemical treatments lead to the etching of mainly Cu and Se, while the Ga and In contents in the solutions remain relatively low. Although lower etching rates are observed in case of $S(NH_4)_2$ compared to KCN, the obtained results confirm that $S(NH_4)_2$ can be used as an alternative selective etchant of $Cu_xSe$ phases present in a CIGSe absorber. The obtained results were further confirmed by top view SEM analysis showing an evolution in the surface morphology of the CIGSe thin film due to the removal of the $Cu_xSe$ capping layer. Similar results were also observed in case of Cu-rich CZTSe absorber layers treated in both solutions (i.e., KCN and $S(NH_4)_2$).

Minority carrier lifetimes of the $CuIn_{0.7}Ga_{0.3}Se_2$ layers were extracted from Time Resolved Photo-Luminescence (TRPL) measurements, for as-deposited layers (0 minutes etch time) and for layers etched in a 20% $(NH_4)_2S$ solution for 2 minutes, 5 minutes and 15 minutes respectively, followed by 3 minutes of rinsing in deionized water. The TRPL measurements were done with a near infrared compact fluorescence lifetime measurement system with an excitation wavelength of 532 nm, The illuminated area had a diameter of about 3 mm and the average laser power was 1.38 mW.

The results of these measurements are shown in FIG. 1. It was found that the carrier lifetime increases with increasing treatment duration (increasing etch time). This may confirm the removal of the $Cu_xSe$ phase, the presence of which is known to decrease the minority carrier lifetime. Similar experiments were done wherein the chalcogenide layers were treated in a KCN solution instead of a $(NH_4)_2S$ solution. After a 15 minutes treatment of the layers in the $(NH_4)_2S$ solution, higher minority carrier lifetimes were measured than for layers treated in the KCN solution using an optimal etching time. This may be an indication that the treatment with the $(NH_4)_2S$ solution also provides a passivation of the chalcogenide layer.

Figure 2:
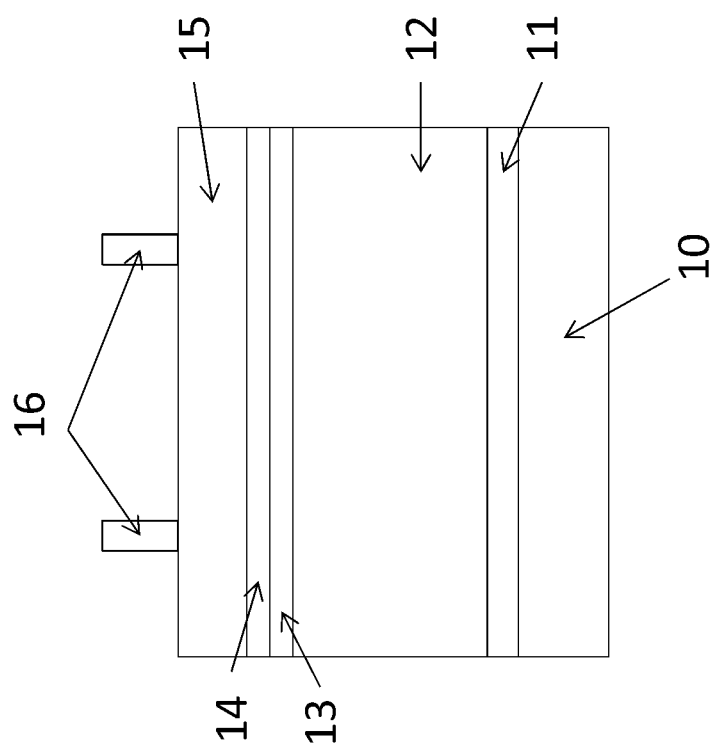
FIG. 2 schematically shows a cross section of a CIGSe photovoltaic cell as used in experiments.

In further experiments, photovoltaic cells comprising a CIGSe absorber layer and a CdS buffer layer were fabricated. A cross section of the cell structure used in the experiments is schematically shown in FIG. 2. On a Soda Lime Glass substrate 10 a Mo back contact layer 11 with a thickness of 400 nm was deposited. A 2 micrometer thick CIGSe absorber layer 12 was then deposited by co-evaporation, optionally followed by etching in a KCN solution according to the prior art or in a $(NH_4)_2S$ solution in accordance with the present disclosure. Different etching times were used: 0 minutes (no treatment), 2 minutes, 5 minutes and 15 minutes. After rinsing in deionized water, a 50 nm thick CdS buffer layer 13 was provided by chemical bath deposition, followed by RF magnetron sputter deposition of a 60 nm thick intrinsic ZnO window layer 14 and a 350 nm thick ZnO:Al (Al doped ZnO) front contact layer 15. On top of the ZnO:Al front contact layer 15 a Ni:AL grid 16 was provided.

Figure 4:
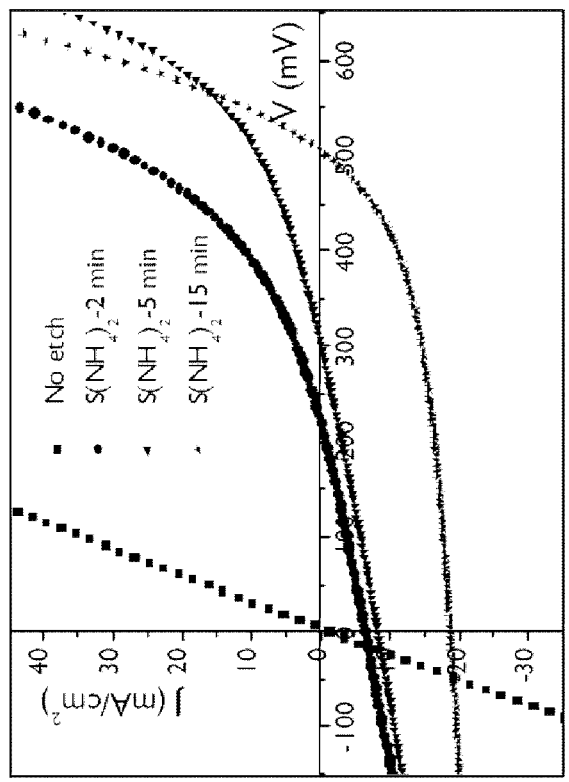
FIG. 4 shows measured current-voltage characteristics under illumination for CIGSe photovoltaic cells wherein the initially Cu-rich CIGSe layer was treated with ammonium sulfide in accordance with the present disclosure, for different treatment times (0, 2, 5 and 15 minutes).
Figure 3:
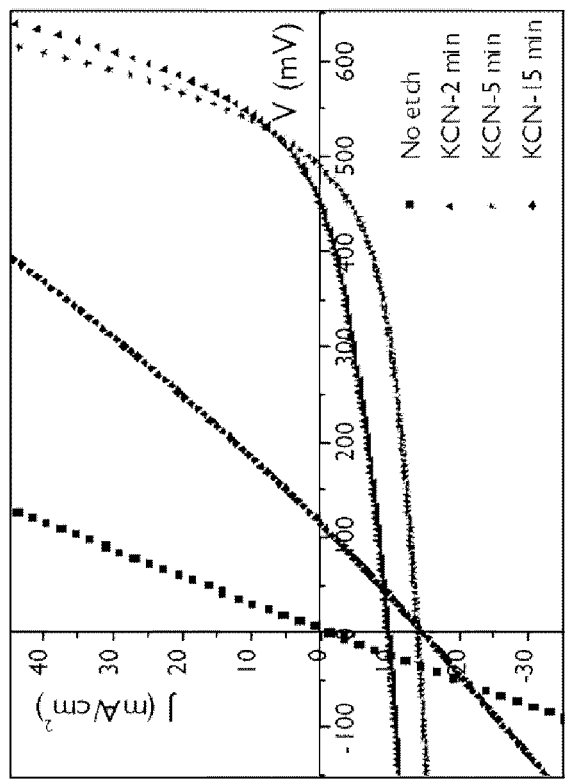
FIG. 3 shows measured current-voltage characteristics under illumination for CIGSe photovoltaic cells wherein the initially Cu-rich CIGSe layer was treated with KCN, for different treatment times (0, 2, 5 and 15 minutes).

FIG. 3 shows measured current-voltage characteristics under AM1.5G illumination for photovoltaic cells wherein a Cu-rich CIGSe layer ([Cu]/([In]+[Ga])=1.1) was treated with KCN, for different treatment times. FIG. 4 shows measured current-voltage characteristics under AM1.5G illumination for photovoltaic cells wherein such CIGSe layer was treated with ammonium sulfide in accordance with the present disclosure, for different treatment times.

The I-V analysis of the Cu-rich samples after different treatment times confirms that the $Cu_xSe$ phase is removed when using a method of the present disclosure (similar to when using KCN) since the diode behavior of the cells is improved. The I-V curves of the reference samples (i.e. without treatment) show as expected a resistance-like behavior due to shunts induced by the presence of a $Cu_xSe$ phase. When increasing the etching time, the $Cu_xSe$ phase is progressively etched and therefore the photovoltaic cell electrical behavior is improved, which is in good agreement with the literature and with SEM pictures. Similar observations can be made for samples treated with KCN and for samples treated with $(NH_4)_2S$. However, for the process conditions used (20% wt $(NH_4)_2S$ solution), the optimal etching time is longer than when using a KCN solution, indicating a lower etching rate in the case of the $(NH_4)_2S$ treatment.

Higher cell efficiencies were obtained for photovoltaic cells wherein the absorber layer was treated with a $(NH_4)_2S$ solution as compared to cells wherein the absorber layer was treated with a KCN solution. This may be related to the passivation of the absorber layer by the $(NH_4)_2S$ solution.

Figure 5:
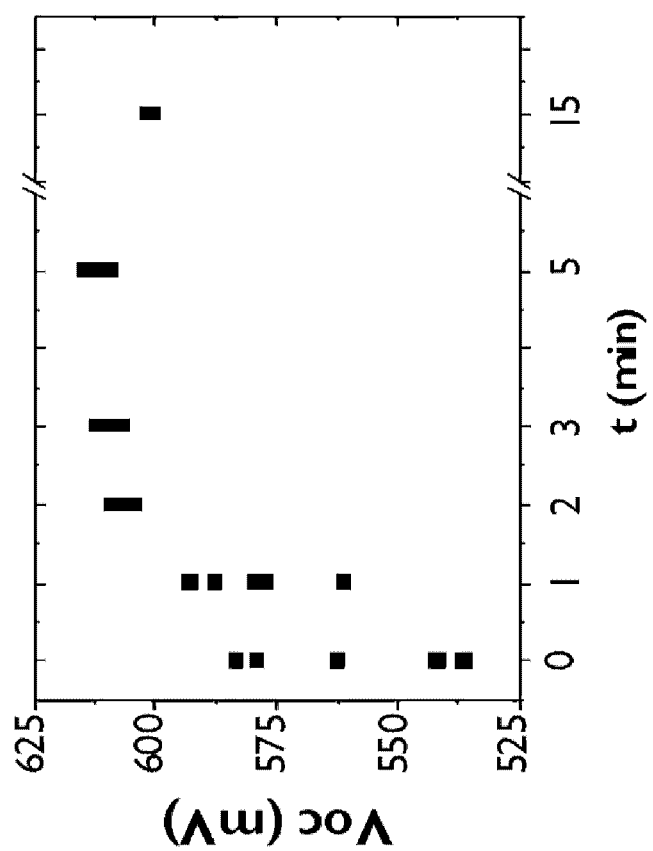
FIG. 5 shows a graph of measured open-circuit voltages $V_{oc}$ for CIGSe cells fabricated according to a method of the present disclosure, as a function of the duration of the ammonium sulfide treatment, for devices with initially Cu-poor CIGSe layers.

A similar experiment was done for photovoltaic cells with an initially Cu-poor CIGSe absorber layer (with [Cu]/([In]+[Ga])=0.9). For these photovoltaic cells a significant improvement of the open circuit voltage ($V_{oc}$) was obtained when using a treatment according to the present disclosure, as well as an improved homogeneity on a series of photovoltaic cells. The $V_{oc}$ was found to increase with increasing treatment time, until a certain point. This is illustrated in FIG. 5, showing a graph of measured open-circuit voltages $V_{oc}$ as a function of the duration of the ammonium sulfide treatment. These results are in agreement with a reduction of the surface recombination velocity of minority carriers as a result of the treatment, and illustrate the passivating effect of a $(NH_4)_2S$ treatment of the present disclosure.

X-ray photoelectron spectroscopy (XPS) analyses have been performed on a Cu-poor CIGSe layer without treatment, on a CIGSe layer after 5 min of chemical treatment using ammonia sulfide and 3 min of rinsing in deionized water, and on a CIGSe layer after 5 min of chemical treatment in KCN and 3 min of rinsing in deionized water. Compared to the reference sample without treatment, there is a clear modification of the chemistry of Se after both treatments ($(NH_4)_2S$ treatment and KCN treatment), which could be either explained by the removal of secondary phases such as $Cu_xSe$ or elemental Se, or by the etching of Se from the CIGSe phase itself. It was further observed that for the layer treated with ammonia sulfide the sample shows a very limited amount of sulfur (about 1 to 2 atomic percentage (at %)) incorporated on the surface of the absorber. This was not the case for the sample treated in KCN. Further analysis of the ammonia sulfide treated sample indicated that a 1 nm to 2 nm thin $Cu(In,Ga)S_2$ layer was present on the surface of the CIGSe layer. The formation of this sulfur containing layer may explain the passivating effect of the $(NH_4)_2S$ treatment of the present disclosure.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single component may fulfill the functions of several items recited in the claims. The mere fact that certain measures are recited in mutually different dependent claims does not indicate that a combination of these measures cannot be used to advantage. Any reference signs in the claims should not be construed as limiting the scope.

While the above detailed description has shown, described, and pointed out novel features of the invention as applied to various embodiments, it will be understood that various omissions, substitutions, and changes in the form and details of the device or process illustrated may be made by those skilled in the technology without departing from the invention.

The invention claimed is:

1. A method for chemically cleaning and passivating a chalcogenide layer, comprising:
    contacting a Cu containing chalcogenide layer with an ammonium sulfide containing ambient, whereby the chalcogenide layer is simultaneously chemically cleaned and passivated, wherein the Cu containing chalcogenide layer is selected from the group consisting of a Group $I_2$-II-IV-$VI_4$ material and a Group I-III-$VI_2$, and wherein the ammonium sulfide containing ambient is a liquid solution or a vapor.

2. The method according to claim 1, wherein the contacting the Cu containing chalcogenide layer with the ammonium sulfide containing ambient comprises immersing the Cu containing chalcogenide layer in a liquid solution containing ammonium sulfide.

3. The method according to claim 2, wherein the liquid solution is a solution of 1 wt % to 50 wt % of ammonium sulfide in water.

4. The method according to claim 1, wherein the contacting the Cu containing chalcogenide layer with the ammonium sulfide containing ambient comprises bringing the chalcogenide layer into an ambient containing ammonium sulfide vapor.

5. The method according to claim 1, wherein the Cu containing chalcogenide layer is a Cu containing chalcogenide semiconductor layer.

6. The method according to claim 1, wherein the Cu containing chalcogenide layer is a Group $I_2$-II-IV-$VI_4$ material layer selected from the group consisting of Copper Zinc Tin Sulfide and Copper Zinc Tin Selenide.

7. The method according to claim 1, wherein the Cu containing chalcogenide layer is a Group I-III-$VI_2$ material layer selected from the group consisting of Copper Indium Gallium Sulfide and Copper Indium Gallium Selenide.

8. The method according to claim 1, wherein chemically cleaned comprises chemically removing a Cu containing secondary phase, and wherein passivating comprises increasing a lifetime of minority carriers in the Cu containing chalcogenide layer near its surface by purely chemical treatment or processes or reducing a recombination velocity of minority carriers in the Cu containing chalcogenide layer at or near its surface by purely chemical treatment or processes.

9. The method according to claim 1, wherein the Cu containing secondary phase is selected from the group consisting of selenides, oxides, and carbonates.

10. The method according to claim 1, wherein the Cu containing secondary phase is selected from the group consisting of copper selenide and copper sulfide.

11. A method for fabricating a photovoltaic cell, comprising:
providing a Cu containing chalcogenide semiconductor layer on a substrate, wherein the Cu containing chalcogenide semiconductor layer is selected from the group consisting of a Group $I_2$-II-IV-$VI_4$ material and a Group I-III-$VI_2$;
contacting the Cu containing chalcogenide semiconductor layer with an ammonium sulfide containing ambient, thereby simultaneously removing impurities from the Cu containing chalcogenide semiconductor layer and passivating the Cu containing chalcogenide semiconductor layer, wherein the ammonium sulfide containing ambient is a liquid solution or vapor containing ammonium sulfide; and thereafter
providing a buffer layer on the Cu containing chalcogenide semiconductor layer.

12. The method according to claim 11, wherein the contacting the chalcogenide semiconductor layer with the ammonium sulfide containing ambient comprises immersing the Cu containing chalcogenide semiconductor layer in a liquid solution containing ammonium sulfide.

13. The method according to claim 12, wherein the liquid solution is a solution of 1 wt % to 50 wt % of ammonium sulfide in water.

14. The method according to claim 11, wherein contacting the Cu containing chalcogenide semiconductor layer with the ammonium sulfide containing ambient comprises bringing the Cu containing chalcogenide semiconductor layer into an ambient containing ammonium sulfide vapor.

15. The method according to claim 11, wherein the buffer layer is selected from the group consisting of a CdS layer, a zinc oxy-sulfide layer, and an indium sulfide layer.

16. The method according to claim 11, further comprising:
providing a rear contact layer on the substrate before providing the Cu containing chalcogenide semiconductor layer on the substrate;
providing a window layer on top of the buffer layer;
providing a front contact layer; and
providing a front contact grid.

17. The method according to claim 11, wherein the Cu containing chalcogenide layer is a Group $I_2$-II-IV-$VI_4$ material layer selected from the group consisting of Copper Zinc Tin Sulfide and Copper Zinc Tin Selenide.

18. The method according to claim 11, wherein the Cu containing chalcogenide layer is a Group I-III-$VI_2$ material layer selected from the group consisting of Copper Indium Gallium Sulfide and Copper Indium Gallium Selenide.

19. The method according to claim 11, wherein removing impurities comprises chemically removing a Cu containing secondary phase, and wherein passivating comprises increasing a lifetime of minority carriers in the Cu containing chalcogenide semiconductor layer near its surface by purely chemical treatment or processes or reducing a recombination velocity of minority carriers in the Cu containing chalcogenide semiconductor layer at or near its surface by purely chemical treatment or processes.

20. The method according to claim 11, wherein the Cu containing secondary phase is selected from the group consisting of selenides, oxides, and carbonates.

21. The method according to claim 11, wherein the Cu containing secondary phase is selected from the group consisting of copper selenide and copper sulfide.

* * * * *

UNITED STATES PATENT AND TRADEMARK OFFICE
CERTIFICATE OF CORRECTION

PATENT NO. : 9,231,148 B2
APPLICATION NO. : 14/500871
DATED : January 5, 2016
INVENTOR(S) : Marie Buffiere et al.

It is certified that error appears in the above-identified patent and that said Letters Patent is hereby corrected as shown below:

In the specification

In column 1 at line 29, Change "($CuIn_{1-x}Ga_X$" to --($CuIn_{1-x}Ga_x$--.

In column 6 at line 26, Change "$S(NHd_2$" to --$S(NH_4)_2$--.

Signed and Sealed this
Fifth Day of July, 2016

Michelle K. Lee
*Director of the United States Patent and Trademark Office*